US008165309B2

(12) United States Patent
Gustaffsson et al.

(10) Patent No.: US 8,165,309 B2
(45) Date of Patent: Apr. 24, 2012

(54) SYSTEM AND METHOD FOR SIMULATION OF NON-LINEAR AUDIO EQUIPMENT

(75) Inventors: Fredrik Gustaffsson, Linköping (SE); Per Connman, Norrköping (SE); Oscar Öberg, Linköping (SE); Niklas Odelholm, Linköping (SE); Martin Enqvist, Linköping (SE)

(73) Assignee: Softube AB, Linkoping (SE)

( * ) Notice: Subject to any disclaimer, the term of this patent is extended or adjusted under 35 U.S.C. 154(b) by 1076 days.

(21) Appl. No.: 10/872,012

(22) Filed: Jun. 21, 2004

(65) Prior Publication Data

US 2004/0258250 A1 Dec. 23, 2004

(30) Foreign Application Priority Data

Jun. 23, 2003 (SE) ....................................... 0301790

(51) Int. Cl.
*H03G 3/00* (2006.01)

(52) U.S. Cl. .................................. 381/61; 381/98; 84/1

(58) Field of Classification Search .................... 381/77, 381/61–63, 95–96; 84/622, 624, 627, 604, 84/626, 662, 664, 736, 737, 603, 609–610, 84/615–616, 649–650, 653–654, 659; 700/94
See application file for complete search history.

(56) References Cited

U.S. PATENT DOCUMENTS

| | | | | |
|---|---|---|---|---|
| 4,809,336 | A | 2/1989 | Pritchard | |
| 4,868,869 | A * | 9/1989 | Kramer | 381/61 |
| 4,991,218 | A | 2/1991 | Kramer | |
| 5,144,096 | A * | 9/1992 | Kunimoto | 84/659 |
| 5,206,448 | A * | 4/1993 | Kunimoto | 84/659 |
| 5,241,692 | A * | 8/1993 | Harrison et al. | 455/79 |
| 5,248,844 | A * | 9/1993 | Kunimoto | 84/622 |
| 5,265,516 | A * | 11/1993 | Usa et al. | 84/600 |
| 5,304,734 | A * | 4/1994 | Kunimoto | 84/661 |
| 5,477,004 | A * | 12/1995 | Kunimoto | 84/625 |
| 5,680,450 | A * | 10/1997 | Dent et al. | 379/406.08 |

(Continued)

FOREIGN PATENT DOCUMENTS

GB 2.040.632 8/1980

(Continued)

OTHER PUBLICATIONS

Title: The Computation of Line Spectral Frequencies Using Chebyshev Polynomials Authors: Peter Kabal and Ravi Ramachandran IEEE Transactions on Acoustics, Speech and Signal Processing, No. 6 Dec. 1986.*

(Continued)

*Primary Examiner* — Vivian Chin
*Assistant Examiner* — Fatimat O Olaniran
(74) *Attorney, Agent, or Firm* — Harness, Dickey & Pierce, P.L.C.

(57) ABSTRACT

The invention describes an apparatus for software or hardware emulation of electronic audio equipment, which characterizes a non-linear behavior. The invention comprises an analog to digital interface (504) for the input audio signal (502), whose output (506) is communicatively coupled to a dynamic non-linearity (508). The output (514) of this dynamic non-linearity is finally communicatively coupled to an interface (516) producing the output audio signal (518). The dynamic non-linearity consists of a mode switching static non-linear function, where the mode parameter (512) is estimated in a function (510) based on the previous values on the input (506) and output (514) of the dynamic non-linearity.

22 Claims, 10 Drawing Sheets

U.S. PATENT DOCUMENTS

| | | | | |
|---|---|---|---|---|
| 5,789,689 | A * | 8/1998 | Doidic et al. | 84/603 |
| 6,208,969 | B1 * | 3/2001 | Curtin | 704/264 |
| 6,350,943 | B1 | 2/2002 | Matsumoto et al. | |
| 6,504,935 | B1 | 1/2003 | Jackson | |
| 6,664,460 | B1 | 12/2003 | Hanson et al. | |
| 6,760,451 | B1 * | 7/2004 | Craven et al. | 381/98 |
| 6,998,528 | B1 * | 2/2006 | Limacher et al. | 84/662 |

FOREIGN PATENT DOCUMENTS

| | | |
|---|---|---|
| JP | 1-502873 | 9/1989 |
| JP | 6342287 A | 12/1994 |
| JP | 8-502153 | 3/1996 |
| JP | 11-202863 | 7/1999 |
| JP | 2001-270927 | 3/2000 |
| JP | 2004-502202 | 1/2004 |
| WO | WO 88/07787 | 10/1988 |
| WO | WO 94/02934 | 2/1994 |
| WO | WO 02/03377 | 1/2002 |

OTHER PUBLICATIONS

Pablo Fernández-Cid et al: 'MWD: Multiband Waveshaping distortion'; DAFX99 Workshop on Digital Audio Effects, Dec. 9-11, 1999., XP002297870 Trondheim, Norway.

US 6,055,290, 04/2000, Xie et al. (withdrawn)

* cited by examiner

SYSTEM AND METHOD FOR SIMULATION OF NON-LINEAR AUDIO EQUIPMENT

FIELD OF THE INVENTION

The present invention relates generally to a system for non-linear audio equipment simulation, and more specifically to the estimation of characteristic parameters in a model of such equipment and real-time simulation of this model.

BACKGROUND AND RELATED ART

There are many kinds of audio equipment that show a non-linear behavior and then inherently are difficult to simulate. Microphones, pre-amplifiers, power-amplifiers and loud speaker cabinets are some examples of non-linear audio equipment. Of particular importance are the old-fashioned amplifiers used by for instance guitarists, that contain electronic vacuum tubes. Professional and amateur guitar players appreciate the sound of classic tube amplifiers. The warm sound of their dynamic distortion has turned out to be quite hard to mimic with transistor based amplifiers. In addition to a small second hand market of original amplifiers, so called re-issues are available commercially. The main drawbacks with these ones are: high price, high cost for spare parts (transformers, tubes, capacitors etc), large manufacturing variations between the tubes, high power consumption and the sometimes unpleasant fact that one has to use a high output level to get saturation and the required distortion. Another inherent drawback is that guitar players want to shift between different amplifiers and special effects, which require several cable re-connections or additional switching hardware, and a lot of expensive and space-requiring hardware.

Therefore, several products exist today for simulating the tube distortion in analog electronics, or using software solutions in digital signal processors. Examples of this kind of technology are found in UK Patent GB 2.040.632 (H. Peavey, *Sound amplifiers*, August 1980, Peavey), U.S. Pat. No. 5,789,689 (M. Doidic, M. Mecca, M. Ryle, and C. Senffner, *Tube modeling programmable digital guitar amplification system*, August 1998, Line 6) and U.S. Pat. No. 6,350,943 (K. Matsumoto, M. Suruga, and Y. Suzuki, *Electric instrument amplifier*, February 2002, Korg). The point is that the products become cheaper, smaller in size and much more flexible in that the user can switch between different amplifiers, preamps, loudspeaker models and additional effects (delay, echo, chorus, reverbation, equalizer, auto-volume and so on). However, when switching between these prior attempts of tube emulating systems and one of the original amplifiers they are said to mimic, musicians and even amateurs can hear the difference.

The task of modeling and simulating a dynamic system is a well-established area in engineering. This area is described in e.g. the text book L. Ljung and T. Glad, *Modeling of dynamic systems* (Prentice-Hall, 1996), where it is pointed out that there is no principal difference between modeling and simulation of economic and biologic systems, paper plants and electric systems. A dynamic system can be any physical or abstract process where one can observe its input and the outputs the process produces. Audio equipment and in particular a tube amplifier fits very well in this framework and is no exception to this general problem. The most critical problem is to find a good model of the dynamical system at hand, and if no physical model can be made, as is the case for the complicated nature of a tube amplifier, one should aim at estimating a model that fits observed input-output data from the system. This task is called system identification, and it is also a quite well established research area with long traditions for identifying models of dynamic systems, see the text books L. Ljung, *System identification, Theory for the user* (Prentice Hall, Englewood Cliffs, N.J., second edition, 1999), and T. Söderström and P. Stoica, *System identification* (Prentice Hall, N.Y., 1989) for instance, and the commercial software packages *System Identification Toolbox for Matlab* (The MathWorks, Inc, Natick, Mass., 1999) and *Frequency Identification Toolbox for Matlab* (The MathWorks, Inc, Natick, Mass., 1995). The general approach is as follows: Design an experiment and collect data from the dynamical system, here the guitar input and the output from the amplifier, for example the loudspeaker signal. 'Guess' a model structure (linear or non-linear discrete time filter, or a combination thereof). Use a numerical algorithm to adjust the free parameters in the model structure such that the discrepancy between the measured signals and model predictions are minimized. For linear systems, there is a variety of model structures and software tools to choose among. The theory of modeling linear dynamics is well-known and found in any text book in signal processing or modeling L. Ljung and T. Glad, *Modeling of dynamic systems* and J. G. Proakis and D. G. Manolakis, *Digital signal processing—principles, algorithms and applications* (Prentice-Hall International, New Jersey, 3 edition, 1996).

For non-linear systems, for instance tube amplifiers, certain series connections of linear black box models with static non-linearities (SNL) (a so called Wiener model) have been suggested, see L. Ljung, *System identification, Theory for the user* and D. Atherton *Nonlinear Control Engineering*. This is also what has been used in previous art, such as U.S. Pat. No. 5,789,689. A typical engineer in the system identification community would try several such structures, use standard software to identify free parameters in each structure from observed input-output data, and probably in the end find a fair approximation but conclude that no known standard structure is perfectly suitable for high-performance tube amplifiers. In prior art there is therefore a lack of satisfying models for simulating tube amplifiers in a natural sounding manner. Our findings is that standardized model structures consisting of series connection of linear dynamics and static non-linearities (SNL's) cannot model the complicated behavior of for instance tubes.

Audio equipment that can be controlled by potentiometers can be simulated in software by using a number of fixed filters, and then interpolating between these. A piece of prior art is the U.S. Pat. No. 6,222,110, which describes a method for interpolating two second order filters.

SUMMARY OF THE INVENTION

The problem to be solved and the object of the invention is to provide an improved method and system for simulating audio equipment in general and tube amplifiers in particular, for instance those found in electric guitar equipment. Aspects of the problem are:

- To provide a general model structure of non-linear audio equipment that contains a set of characteristic parameters that can be changed to mimic amplifiers of different models and manufacturers.
- To provide a systematic way to estimate these parameters in an automatic procedure to quickly be able to model new amplifiers.
- A further aspect of the problem is to provide an efficient algorithm for simulating this model in real-time with short enough time delay.

In accordance with the present invention, the characteristic behavior of the audio equipment is modeled as a dynamic non-linearity (DNL), where a mode parameter decides which SNL should be active. This mode parameter can be interpreted as the operating point of the audio device and it may for instance include hysteresis effects and the temperature, measured as the recent energy.

Further, the invention comprises a particular structure on the DNL, which is built up from a linear combination of a basis for the SNL, where the so called Chebyshev polynomial basis is one possible choice. This gives many practical advantages for both identification and simulation performance, as will be described later. An important consequence, compared to related art, is that the particular structure that is used does not require over-sampling.

The invention also comprises an efficient identification experiment for estimating the coefficients in the Chebyshev expansion, or any other, basis expansion, of the DNL. In accordance with the invention inputting sinusoids of different amplitudes is sufficient for estimation of these coefficients, and it is shown that these are related to the Fourier series expansion of the measured output of the audio equipment, enabling efficient algorithms, such as the fast Fourier transform (FFT) or more dedicated algorithms to be used.

The invention describes an apparatus for software or hardware emulation of electronic audio equipment, which characterizes a non-linear behavior. The invention comprises an analog to digital interface (504) for the input audio signal (502), whose output (506) is communicatively coupled to a dynamic non-linearity (508). The output (514) of this dynamic non-linearity is finally communicatively coupled to an interface (516) producing the output audio signal (518). The dynamic non-linearity consists of mode switching static non-linear function, where the mode parameter (512) is estimated in a function (510) based on the previous values on the input (506) and output (514) of the dynamic non-linearity.

In another embodiment of the invention, a linear filter is used to change the frequency content of the interfaced audio signal (504) before it is coupled to the DNL (508). Yet another linear filter can be used on the DNL's output (514) to change the audio output frequency characteristics.

It has been validated that this structure is particularly well suited for emulation of guitar tube amplifiers, where the dynamic non-linearity models the complicated tube behavior, whose characteristics can be explained by the operating mode of the tube which physically may be explained by one or more of the following quantities of the input signal: energy, amplitude, hysteresis and frequency.

BRIEF DESCRIPTION OF THE DRAWINGS

The present invention will be further explained by means of exemplifying embodiments in conjunction with the accompanying drawings, in which.

DETAILED DESCRIPTION OF THE INVENTION

The invention is based on a model of first the linear parts and then a dynamic non-linear model structure for the non-linear devices, identification of the free parameters in this non-linear model structure and finally a way to simulate this model. The total audio equipment emulator is outlined in FIG. 1.

Figure 6:
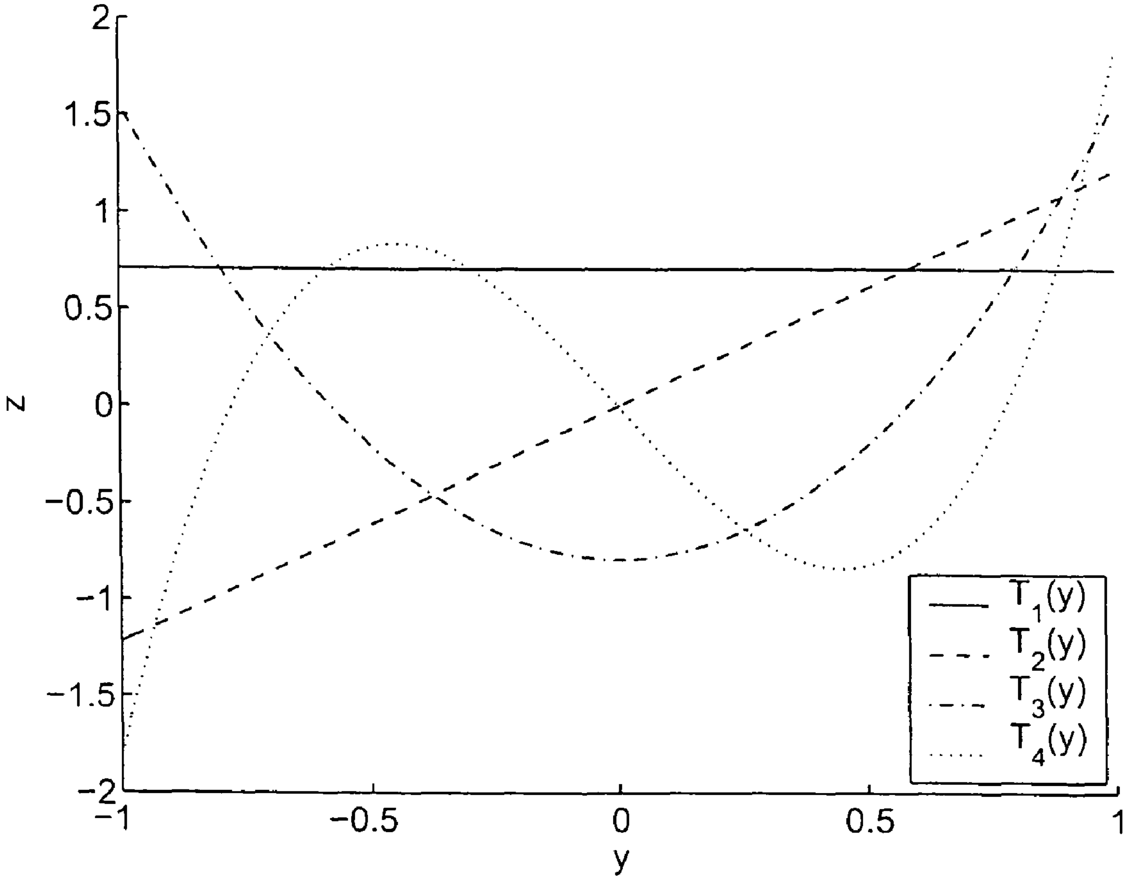
FIG. 6 shows the first four orthonormalized polynomial basis functions.

Though the invention applies to a range of audio equipment, we will sometimes speak of a particular application of simulating a tube pre-amplifier as illustrated in FIG. 6. Here a guitar (302) is connected to a pre-amplifier (304), whose output is power amplified (306) and fed to the speakers (308). This is just for illustrative purposes, and a tube can be seen to be a typical non-linear audio equipment in this context.

General Setting

The invention comprises a method and a realization of the method that may be realized in hardware, software or a combination thereof. The most feasible realization of the invention is likely to be in the shape of a computer program product preferably comprising a data carrier provided with program code or other means devised to control or direct a data processing apparatus to perform the method steps and functions in accordance with the description. A data processing apparatus running the inventive method typically includes a central processing unit, data storage means and an I/O-interface for signals or parameter values. The invention may also be realized as specifically designed hardware and software in an apparatus or a system comprising mechanisms and functional stages or other means carrying out the method steps and functions in accordance with the description.

Modeling the Linear Parts

Figure 1:
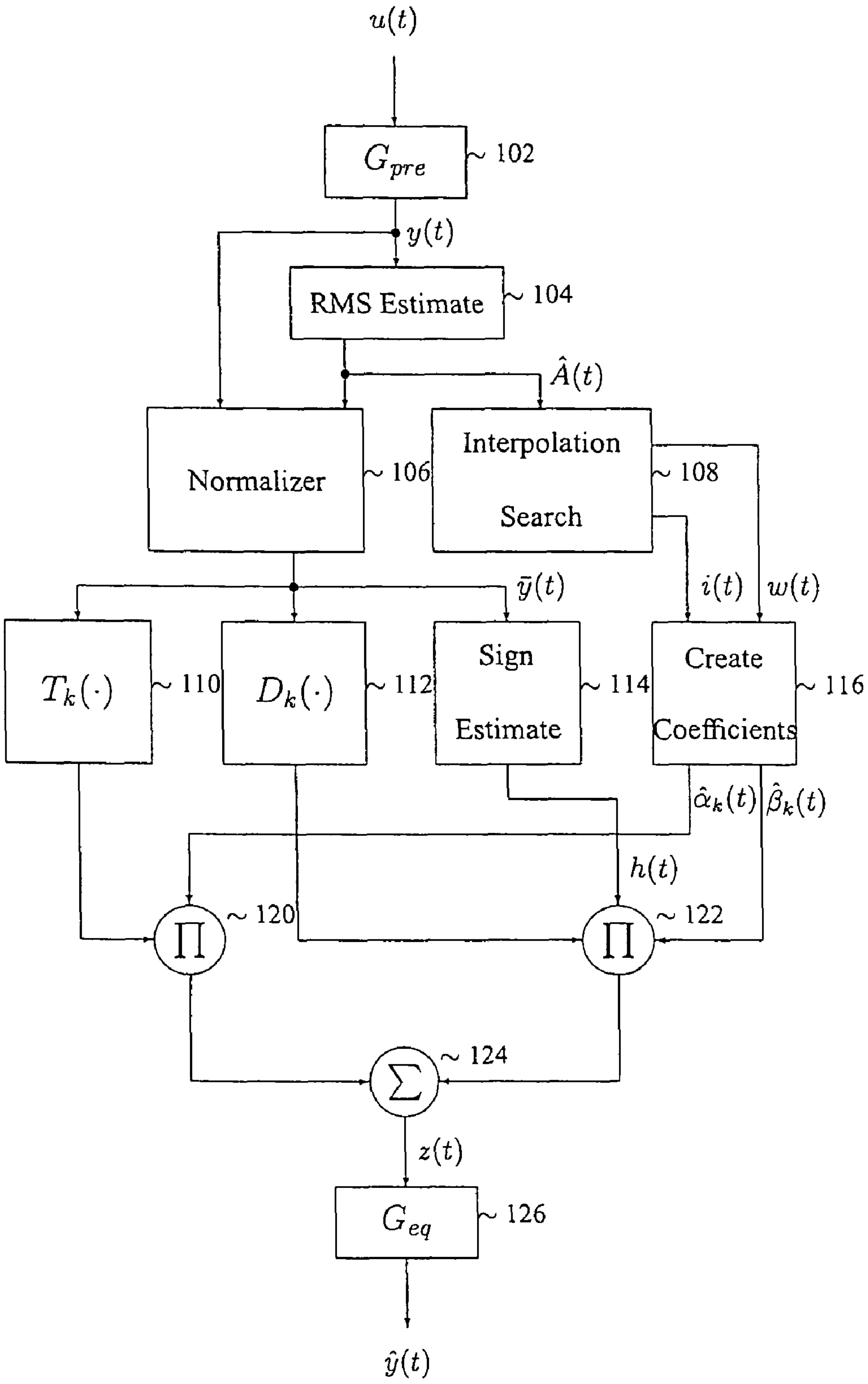
FIG. 1 shows a block diagram showing the structure of the simulation.

An embodiment of the invention comprises modeling of linear parts in the electronic device, denoted $G_{pre}$ (102) in FIG. 1. The modeling of linear dynamics is preferably carried out in a per se known manner, for example shown in the above cited prior art.

The parts of the amplifier that include only passive components like resistors and capacitors, can be modeled theoretically with high accuracy, at least if all component values are known. The procedure to model and simulate the linear part is well-known from for instance the text books above, but is an important preliminary step for this invention. First, the electrical circuit with passive components will provide a continuous time filter. In accordance with an embodiment of the invention, the modeling will provide a continuous time filter $G(s; v_{norm})$, $$G(s;\, v) = \frac{d_0 s^m + d_1 s^{m-1} + \ldots + d_m}{s^n + c_1 s^{n-1} + \ldots + c_n} \tag{1}$$

Here s is the Laplace operator related to the frequency $f$ (in [Hz]) as $s=i2\pi f$, and $v_{nom}$ denote the nominal component values. The parameters $d_i$ and $c_i$ can be computed from the known component values.

Since a digital implementation is used, this model can be converted to a discrete time model H (z; θ). Here $z=e^{i2\pi f}$ is the z-transform operator and θ is the vector of parameters in the transfer function, which takes the form $$H(z;\theta)=\frac{b_0z^m+b_1z^{m-1}+\ldots+b_m}{z^n+a_1z^{n-1}+\ldots+a_n} \tag{2}$$

where $\theta=(a_1, a_2, \ldots, a_n, b_0, b_1, \ldots, b_m)^T$. The point is that such a discrete time filter is simple to implement and simulate in software. That is, once H (z; θ) is determined, simulation of the linear part is straightforward. The transformation from v to θ can be computed in many ways, for instance using Tustin's formula or zero-order hold approximations, see the text book Åström and Wittenmark, *Computer Controlled Systems* (Prentice Hall, 1984).

This is fine if the component values are known exactly, and if the circuit diagram is available. Consider first the case when a circuit diagram is available, but the component values are uncertain, or have been changed by the owner. There are two main approaches for finding the correct values. The first method works in the time domain, cf. e.g. the prior art book L. Ljung, *System identification, Theory for the user*. Generate an arbitrary input signal, usually random numbers, and collect the signals $u_t$, $y_t$. Then adjust the parameters so that the model predictions are minimized $$\hat{\theta}=\arg\min_{\theta}\|y_t-H(q;\theta)u_t\|^2 \tag{3}$$

The second method applies in the frequency domain, see e.g. the prior art text books J. Schoukens and R. Pintelon, *Identification of linear systems. A practical guideline to accurate modeling* (Pergamon Press, U.K., 1991) and J. Schoukens and R. Pintelon, *System Identification—A frequency domain approach* (IEEE Press 2003). Generate a periodic input $u_t$ and measure the output $y_t$ it generates. Both the input and output will in the frequency domain consist of a finite number of frequencies $f_k$, k=1, 2, . . . , M. Then adjust the parameters to minimize a frequency weighted least squares criterion $$\hat{\theta}=\arg\min_{\theta}\sum_{k=1}^{M}w_k\left\|\frac{Y(f_k)}{U(f_k)}-H(e^{i2\pi f_kT_s};\theta)\right\|^2. \tag{4}$$

Computing the structure in equation (1) and then equation (2) from a circuit scheme is a quite tedious task to do for each new amplifier that is going to be modeled. An alternative used in an embodiment of the invention is to establish a general black-box model of the form as in equation (2), where one guesses or uses model selection criteria to choose m and n, collect input-output data in an identification experiment and then estimate the parameters with standard methods, for instance available in the system identification or frequency domain identification toolboxes in Matlab. This will provide an H (z; $\hat{\theta}$).

Interpolation of the Linear Parts

A flexible linear part in an electronic device, $G_{pre}$ (102) and $G_{eq}$ (126) in FIG. 1, can be controlled by the user by turning potentiometers. Such a change influences all coefficients in the filter H (z) in Equation (2), which thus has to be recalculated. One way to avoid this, is to compute the filter H (z) for a number of potentiometer settings, and then interpolate between these. This is important for equalizers and tonestacks, which usually have 3-4 different potentiometers controlling the tone. Another interesting application is to let a pedal or the output from another control unit replace the potentiometers. Still, the linear filter should be interpolated from tabled filters. Below, an accurate method with little memory requirement is described.

In one dimension (one potentiometer), the theory is simple. Let the potentiometer value be represented by $0\leqq u\leqq 1$, and suppose we have computed the filter H (z; $u_i$) for i=1, 2, . . . , n. The user then chooses u such that $u_k\leqq u\leqq u_{k+1}$. The interpolated filter is then $$H(z;u)=H(z;u_k)\frac{u_{k+1}-u}{u_{k+1}-u_k}+H(z;u_{k+1})\frac{u-u_k}{u_{k+1}-u_k}. \tag{5}$$

Further, for two-dimension linear interpolation we have the values u, v such that $u_k\leqq u\leqq u_{k+1}$ and $v_k\leqq v\leqq v_{k+1}$, and the interpolated filter is given from the pre-computed H (z; $u_i$, $v_j$) by $$\begin{aligned}H(z;u,v)=&\\ &H(z;u_k,v_l)\frac{u_{k+1}-u}{u_{k+1}-u_k}\frac{v_{l+1}-v}{v_{l+1}-v_l}+H(z;u_{k+1},v_l)\frac{u-u_k}{u_{k+1}-u_k}\frac{v_{l+1}-v}{v_{l+1}-v_l}+\\ &H(z;u_k,v_{l+1})\frac{u_{k+1}-u}{u_{k+1}-u_k}\frac{v-v_l}{v_{l+1}-v_l}+\\ &H(z;u_{k+1},v_{l+1})\frac{u-u_k}{u_{k+1}-u_k}\frac{v-v_l}{v_{l+1}-v_l}\end{aligned} \tag{6}$$

Multidimensional linear interpolation is computed as a straightforward extension of these formulas.

Instead of interpolating filters, which increases the filter order, it is more practical to interpolate the filter poles/zeros or filter coefficients. For instance, the numerator coefficients in Equation (2) can be computed as $$\begin{aligned}b_i(u,v)=&\\ &b_i(u_k,b_l)\frac{u_{k+1}-u}{u_{k+1}-u_k}\frac{v_{l+1}-v}{v_{l+1}-v_l}+b_i(u_{k+1},v_l)\frac{u-u_k}{u_{k+1}-u_k}\frac{v_{l+1}-v}{v_{l+1}-v_l}+\\ &b_i(u_k,v_{l+1})\frac{u_{k+1}-u}{u_{k+1}-u_k}\frac{v-v_l}{v_{l+1}-v_l}+b_i(u_{k+1},v_{l+1})\frac{u-u_k}{u_{k+1}-u_k}\frac{v-v_l}{v_{l+1}-v_l}\end{aligned} \tag{7}$$

Still, the number of pre-computed filter coefficients that need to be stored in memory is too high. Ten different potentiometer settings for four potentiometers implies $10^4$ set of filter coefficients. Another embodiment of the invention is to use very few potentiometer settings, for instance only 2, and include a scalar pre-compensation function $\bar{u}^i=f_i(u^i)$ for each potentiometer i=1, 2, 3, . . . , K. That is, first each potentiometer setting, $u^i$ is first transformed by a one-dimensional non-linear function $f_i$, then a multidimensional interpolation is applied using the compensated potentiometer settings. The non-linear function $f_i$ is preferably stored as a table and one-dimensional interpolation applied. Here, only $2^4$ different coefficient sets need to be pre-computed and stored in memory. Practice has shown that audio equipment as tone stacks are interpolated very accurately with this method.

Simulation of the Linear Parts

The linear parts in the electronic device, denoted $G_{pre}$ (102) and $G_{eq}$ (126) in FIG. 1, are subject to numerical ill-conditioning. Simulating Equation (2) can result in an unstable output, or at least not as accurate as desirable. This is in particular a problem for highly resonant audio devices as loudspeakers. An embodiment of the invention comprises the use of numerically robust basis functions and delta operators as outlined below.

It is wellknown that any linear transfer function can be described as a sum of a basis function expansion. The basis functions can for instance be second order orthonormal Kautz filters, see *Identification of Resonant Systems using Kautz Filters*, Bo Wahlberg, Proceedings of the 30th Conference on Decision and Control, 1991, pages 2005-2010. The Kautz basis is a set of second order filters of the form $$\psi_i^{odd}(f_i, g_i, z) = \frac{\sqrt{1-g_i^2}\,(z-f_i)}{z^2+f_i(g_i-1)z-g_i},\ i=2k-1 \tag{8}$$

$$\psi_i^{even}(f_i, g_i, z) = \frac{\sqrt{(1-g_i^2)(1-f_i^2)}}{z^2+f_i(g_i-1)z-f_i},\ i=2k \tag{9}$$

and the filter H (z) in (2) can be written $$H(z) = \frac{b_0z^m+b_1z^{m-1}+\ldots+b_m}{z^n+a_1z^{n-1}+\ldots+a_n} \tag{10}$$

$$= \sum_{i=1}^{n} h_i\psi_i(f_i, g_i, z), \tag{11}$$

Here, the coefficients $f_i$, $g_i$ are uniquely given by the coefficients $a_i$, and the coefficients $h_i$ are given from a linear system of equations from the coefficients $b_i$. The simulated output is know computed as a sum of second order filter outputs as follows:

$$Y(z) = \sum_{i=1}^{n} h_iY_i(z) \tag{12}$$

$$Y_k(z) = \psi_i(f_i, g_i, z)U(z), \tag{13}$$

where U (z) is the z-transformed input and Y (z) the z-transformed output.

A further embodiment of the invention involves to use the delta-operator instead of the z-transform based shift operator in the filter implementation. This can also be seen as a different basis, where the in signal processing dominating z-transform variable is replaced by $\delta=(z-1)/T$, where T is the sampling interval. The theory is described in for instance *Sampling in digital signal processing and control*, A. Feuer and G. C. Goodwin, Birkhauser, 1996.

Structure of the Dynamic Non-Linearity (DNL)

After all linear parts in the electronic device are modeled according to the previous section, we next focus on the non-linear parts. In this section, we propose a non-linear dynamic model structure which is very efficient in modeling non-linear electronic devices The idea is to consider the electric device as a black box with input $u_t$ and output $y_t$, and model what is in between.

In fully controlled experiments, we can generate arbitrary $u_t$ and collect the device's output $z_t$. Due to the sensitive feedback loops in for instance tubes, we cannot put a probe into the amplifier and measure the tube input $y_t$ directly. However, using thae linear model from the previous section, we can compute $y_t=H(q;\hat{\theta})u_t$ and use this instead. The question now is what structure to use for the DNL. We propose the following one $$z_t=f(y_t; m_t). \tag{14}$$

Here $m_t$ is a mode parameter that depends on the operating point of the tube $$m_t=g(y_t,z_t,y_{t-1},z_{t-1},y_{t-2},z_{t-1},\ldots) \tag{15}$$

The operating point may include the input derivative, amplitude, frequency and power, for instance. We consider the function $f(y; m)$ to be continuous in m, so that we can tabulate different static non-linearities (SNL) and then interpolate between these. For example, if $m_t$ is a scalar mode parameter, we can tabulate $f(y; k)$ at the integers, and for a $k\leqq m\leqq k+1$ we use $$z=(k+1-m)f(y;k)+(m-k)f(y;k+1). \tag{16}$$

We have found the following mode parameters to be of particular importance for tube modeling:

The hysteresis mode $h_t$ defined by $$h_t = \begin{cases} h_{t-1}, & -1<y_t<1 \\ 1, & y_t=1 \\ -1, & y_t-1 \end{cases} \tag{17}$$

This is motivated by the observation that the tube does not follow the same path going down from +1 to −1, as when going from −1 to +1.

The energy, amplitude or peak value of the signal $y_t$ during the last few milliseconds. We denote this mode parameter $A_t$, since it is related to the amplitude of the input. This is an empirical observation from experiments, but could be motivated by the temperature sensitivity of the tube characteristics or fluctuations in the voltage from the power supply.

That is, we have two mode parameters that decide which SNL to be used. We stress that this mode switching non-linear behavior is crucial for accurate tube modeling and that such a DNL cannot be achieved by a series combination of a linear filters and SNL's as has been suggested in previous patents.

That is, the DNL now takes the form $$z_t=f(y_t; A_t,h_t) \tag{18}$$

That is, for each $A_t$, $h_t$ we have a SNL, and the next question is to decide on a structure for each SNL.

We next need a structure for each SNL $z=f(y)$. Since this structure will be the same for each mode parameter, it will in the sequel be suppressed. Consider an arbitrary basis $P_k(y)$ for a general class of functions defined on the interval $-1\leqq y\leqq 1$. These so called Legendre polynomials satisfy by the definition of an orthonormal basis the orthonormality conditions $$\int_{-1}^{1} P_k(y)P_l(y)dy = \begin{cases} 0, & k\neq l \\ 1, & k=l \end{cases} \tag{19}$$

These can for instance be mathematically derived from the (non-orthonormal) basis $p_k(y)=y^k$ with a Gram-Schmidt orthonormalization procedure. The first four basis functions using this principle are shown in FIG. 6.

Since this is a basis for all functions $f$: [−1,+1]→[−1,+1], this implies that any function can be approximated arbitrary well by a finite sum $$z = f(y) = \sum_{k=0}^{K} a_k P_k(y) \tag{20}$$

Figure 8:
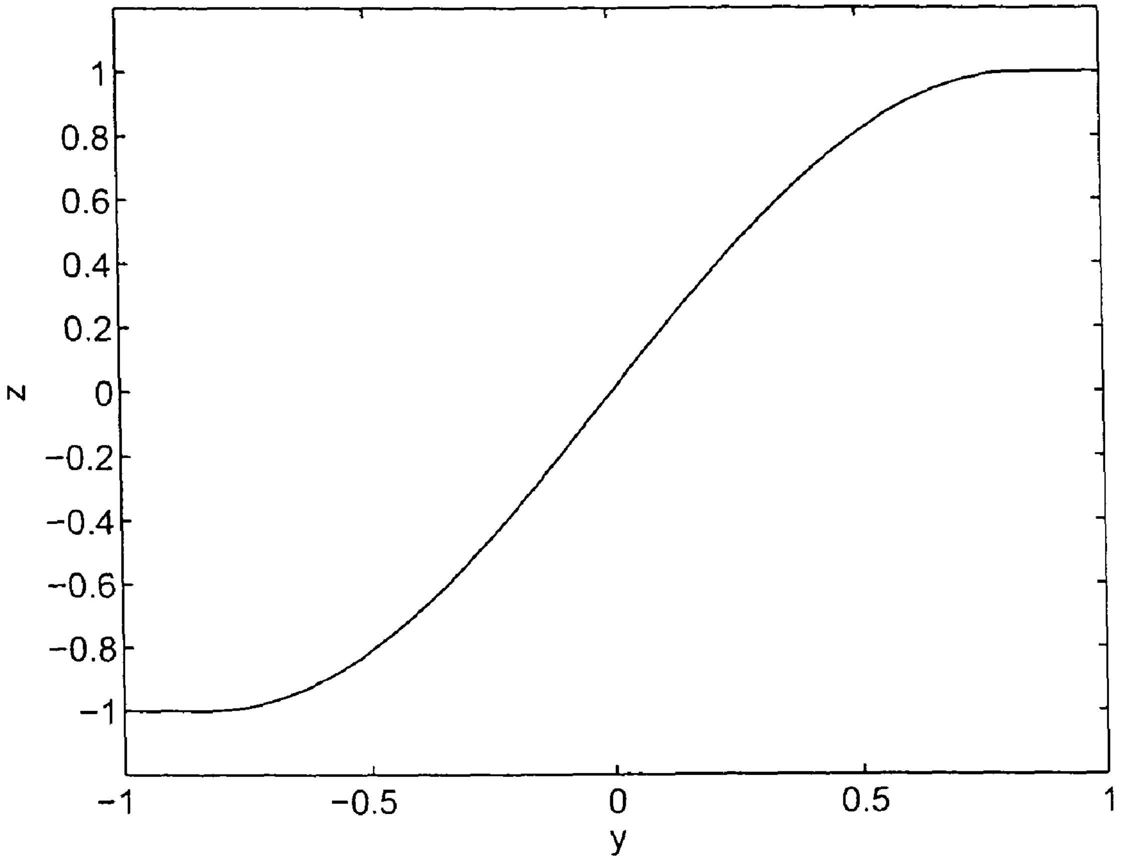
FIG. 8 shows a typical non-linear function.
Figure 9:
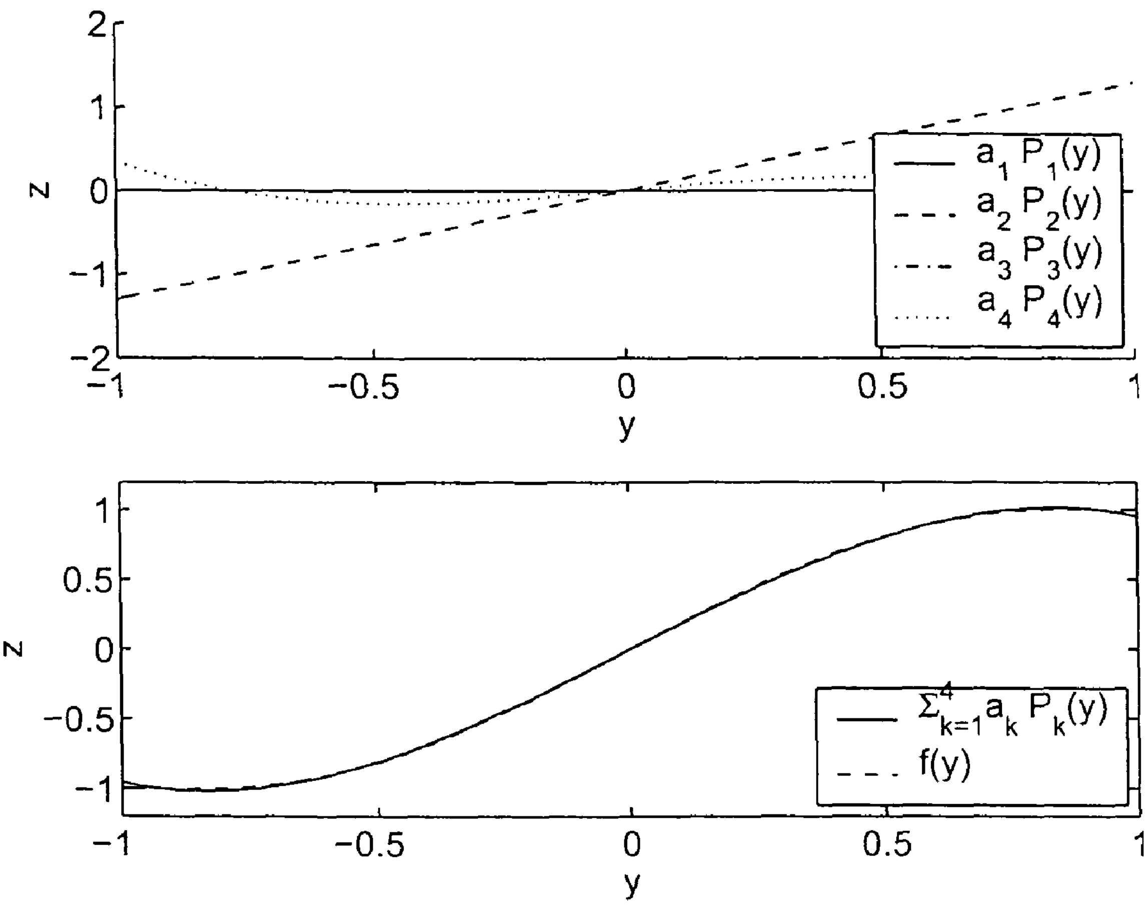
FIG. 9 shows the weighted Chebyshev basis functions in FIG. 3, weighted with respect to the SNL in FIG. 4, while the lower plot shows the approximation and function itself.

FIG. 8 shows an example of a non-linear function and FIG. 9 how this function is well approximated by an expansion using four basis functions.

Now, hysteresis implies that we have two SNL's, one for h=1 and one for h=−1. Denote these two SNL's $f_h(y)$. We can from these define the even and odd SNL's by $$f_e(y) = \frac{f_{h=-1}(y) + f_{h=1}(y)}{2} \tag{21}$$

$$f_o(y) = \frac{f_{h=-1}(y) - f_{h=1}(y)}{2} \tag{22}$$

That is, we need two basis expansions, one for the even and one for the odd part of the hysteresis function. From this, it is clear that the total DNL, including the mode parameter, can be written $$z = f(y; A, h) = \sum_{k=0}^{K} (a_k(A) + hb_k(A))P_k(y) \tag{23}$$

This is the structure we have found most useful. However, other mode parameters can also give good performance, so the invention is not limited to this particular choice of modes.

Estimation of the coefficients can be done with standard least squares algorithms, by noting that equation (23) can be written as a linear regression model $$z = \begin{pmatrix} P_1(y) \\ P_2(y) \\ \vdots \\ P_K(y) \\ hP_1(y) \\ hP_2(y) \\ \vdots \\ hP_K(y) \end{pmatrix}^T \begin{pmatrix} a_1(y) \\ a_2(y) \\ \vdots \\ a_K(y) \\ b_1(y) \\ b_2(y) \\ \vdots \\ b_K(y) \end{pmatrix} \tag{24}$$

$$= \varphi^T(y, h)\theta(A) \tag{25}$$

From an experiment, we get $z_t$, $y_t$, $h_t$, t=1, 2, . . . , N, and then form the over-determined system of equations:

$$\begin{pmatrix} z_1 \\ z_2 \\ \vdots \\ z_N \end{pmatrix} = \begin{pmatrix} \varphi(y_1, h_1) \\ \varphi(y_2, h_2) \\ \vdots \\ \varphi(y_N, h_N) \end{pmatrix} \theta(A) \tag{26}$$

which can be solved in the least squares sense for each input amplitude A.

Figure 10:
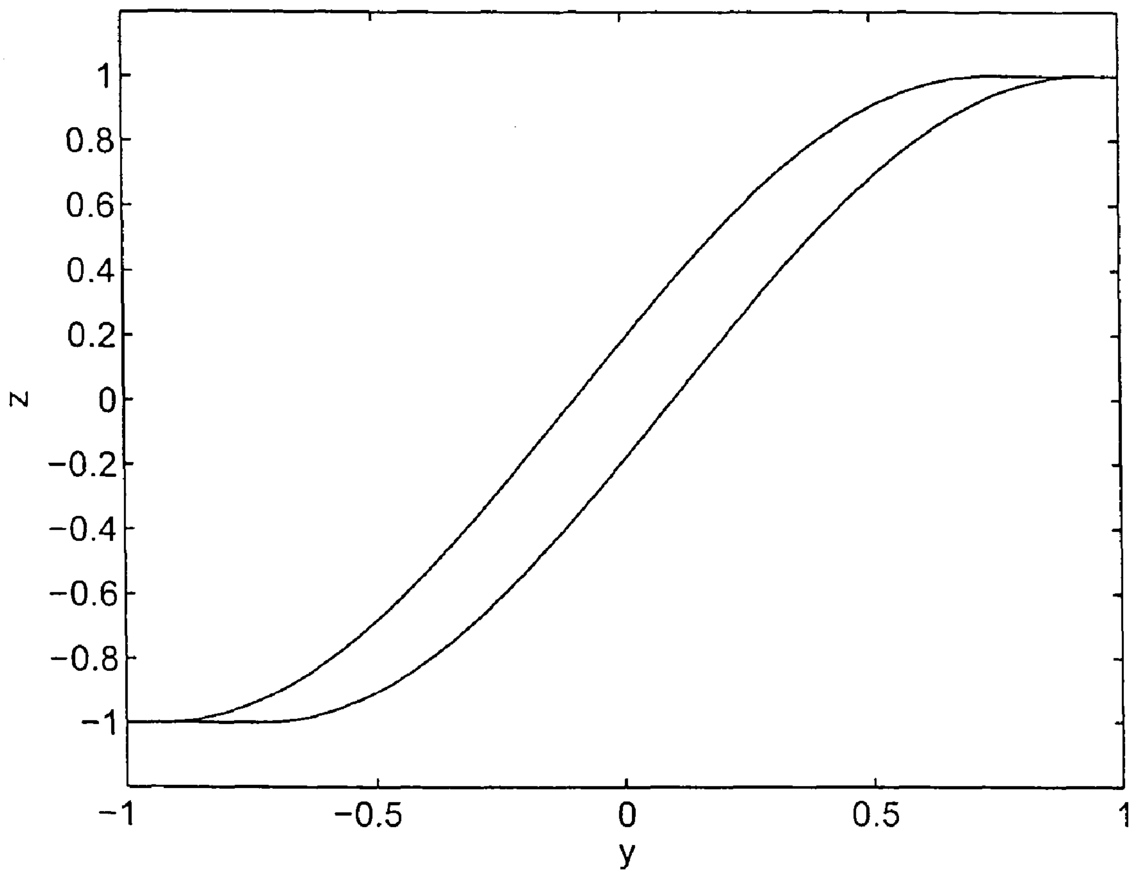
FIG. 10 shows a non-linear function subject to hysteresis.
Figure 11:
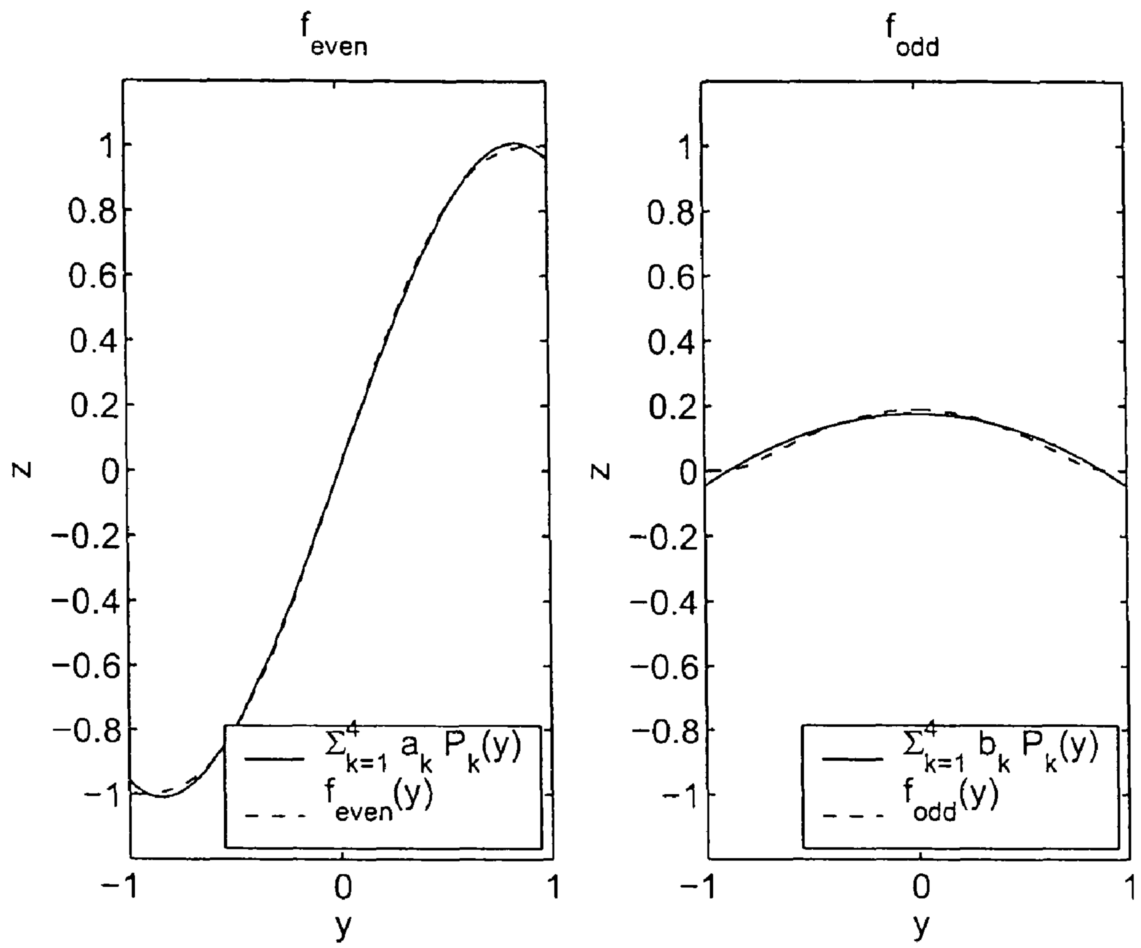
FIG. 11 shows a the even and odd functions of the non-linear functions in FIG. 6, and the corresponding Chebyshev expansion model.

FIG. 10 shows an example of a non-linear function subject to hysteresis, and FIG. 11 how the even and odd parts of this function, respectively, are well approximated by expansions using four basis functions.

Chebyshev Polynomials

Figure 7:
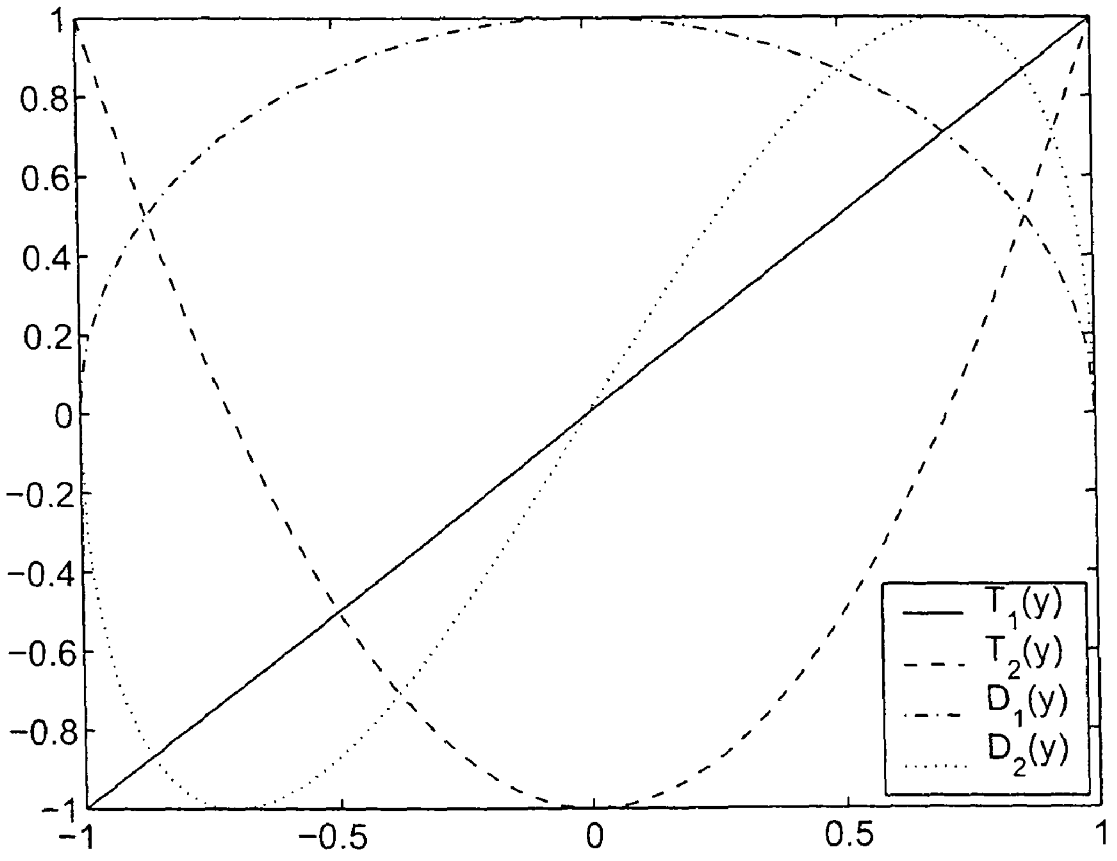
FIG. 7 shows the first four Chebyshev basis functions.

We will motivate in several ways why a Chebyshev polynomial expansion is an ingenious way for modeling tube behavior. First, the definition of these polynomials, here called $\overline{P}_k(y)$, is $$\int_{-1}^{1} \frac{1}{\sqrt{1-y^2}} \overline{P}_k(y)\overline{P}_l(y)dy = \begin{cases} 0, & k \neq l \\ 1, & k = l \end{cases} \tag{27}$$

which differs from the polynomials $P_k(y)$ defined in equation (19) by the weighting factor $1/\sqrt{1-y^2}$. The first four basis functions are shown in FIG. 7.

These basis functions can be written explicitly. It is standard in literature and convenient for further discussion to split the basis function $\overline{P}_k(y)$ into one basis $T_k(y)$ for all odd functions on [1, 1] and one basis $D_k(y)$ for all even functions on [−1, 1]. These are then given by $$T_k(y) = \cos(k \arccos(y)) \tag{28}$$

$$D_k(y) = \sin(k \arccos(y)) \tag{29}$$

We can now expand the odd and even parts of the hysteresis function as $$z = f(y; A, h) = \sum_{k=0}^{K} \alpha_k(A)T_k(y) + h\beta_k(A)D_k(y) \tag{30}$$

Referring to the embodiment of the invention shown in FIG. 1, the input to the DNL is y, the DNL is represented by blocks $T_k$ and $D_k$, and z is its output.

The weighting factor $1/\sqrt{1-y^2}$ makes the polynomial more sensitive to catch the critical non-linearities around ±1, which is of utmost importance for audio applications. An important practical consequence is that relatively few basis functions are enough for accurate modeling, which facilities simulation, and that the softness of the basis functions turn out to eliminate the computational expansive over-sampling, which is usually needed to avoid unwanted harmonics when simulating non-linear functions.

Identification of the DNL

The DNL structure from the previous section is very flexible and efficient for modeling non-linear electric devices, but we still need a procedure to determine the parameters in the structure. Here we describe how the parameters in the DNL can be computed from measured inputs $u_t$ and outputs $y_t$. In FIG. 1, these parameters are denoted $\hat{\alpha}_k(t)$ and $\hat{\beta}_k(t)$ and are determined in the block labeled 'Create Coefficients'.

The general identification problem is to first design the input $u_t$ and then to find an algorithm for fitting $\alpha_k(A, h)$ in equation (23) to the observed data. Because of the new concept of a DNL, there is no available standard software for this problem. We suggest to use inputs $u_t$ such that $y_t$=A cos ($2\pi f_0$). This is achieved by $$u_t = \frac{A}{|H(e^{i2\pi f_0}, \theta)|} \cos(2\pi f_0 - \arg(H(e^{i2\pi f_0}, \theta))) \tag{31}$$

We will in the following omit the dependence of A, and assume that the input $y_t$ to the SNL is scaled to unity magnitude.

It can be proven that the Fourier series coefficients of $z_t$ with a sinusoid as the input correspond to the coefficients $\alpha_k$, $\beta_k$ in the expansion (30) (again omitting the mode parameter for brevity), so we can compute them theoretically for a given function $f(y)$ as $$\alpha_0 = \frac{1}{\pi}\int_0^{\pi} f(\cos(\phi))d\phi \tag{32}$$

$$\alpha_k = \frac{2}{\pi}\int_0^{\pi} f(\cos(\phi))\cos(k\phi)d\phi,\ k > 0 \tag{33}$$

$$\beta_0 = 0 \tag{34}$$

$$\beta_k = \frac{2}{\pi}\int_0^{\pi} f(\sin(\phi))\sin(k\phi)d\phi,\ k > 0. \tag{35}$$

We design $f_0$, the sampling interval $T_s$ and the number of data N such that $f_0$ is a multiple of $1/(NT_s)$. We can then use the fast Fourier transform (FFT) or more dedicated and efficient algorithms to compute $Z(e^{i2\pi f_0 k})$ for k=0, 1, 2, . . . , $1/(T_s f_0)$, and let $$\hat{\alpha}_k(A)=\text{real}(Z(e^{i2\pi f_0 k})),\ k=0, 1, 2, \ldots, K \tag{36}$$

$$\hat{\beta}_k(A)=\text{imag}(Z(e^{i2\pi f_0 k})),\ k=0, 1, 2, \ldots, K \tag{37}$$

The order K of the approximation can be chosen automatically by observing when the Fourier series coefficients become insignificant.

The choice of Chebyshev polynomials can be theoretically justified for SNL modeling in general and tube modeling in particular as follows. The polynomial $$z = \hat{f}(y) = \sum_{k=0}^{K} \alpha_k T_k(y) \tag{38}$$

where $\alpha_k$ are computed from equation (32) can be shown to be the polynomial g(y) of degree less than or equal K that minimizes the least squares approximation $$\hat{f}(y) = \arg\min_g \int_{-1}^{+1} \frac{1}{\sqrt{1-y^2}}(f(y)-g(y))^2 dy \tag{39}$$

See for instance the text book Fox and Parker, *Chebyshev polynomials in numerical analysis* (1968). The weighting factor $1/\sqrt{1-y^2}$ is crucial for tubes, since it is large for y=±1 and thus increases the accuracy of the approximation near ±1, exactly where the tube's particular soft sound is created! Furthermore, the approximation $\hat{f}$ will be very close to the polynomial of order less than or equal to K that minimizes the maximum error $$\hat{f}(y) \approx \arg\min_g \max_{y\in[-1,+1]} |f(y)-g(y)|. \tag{40}$$

See the text book Å. Björck and G. Dahlquist, *Numerical mathematics* (Compendium, to be published, 1999) for instance.

Simulating the DNL

The previous sections have first suggested a new dynamic non-linear (DNL) model structure and how to estimate the free parameters. We now describe in detail how the DNL can be simulated efficiently, which is the final step in emulating a non-linear electronic device according to our invention.

Computer-based, or signal processor based, simulation of our model begins with a sample and hold circuit and an AD converter. Design issues include the choice of sample rate $f_s=1/T_s$ and the number of quantization bits. How this should be done is described in any text book in signal processing, see e.g. the text books J. G. Proakis and D. G. Manolakis, *Digital signal processing—principles, algorithms and applications* and F. Gustafsson, L. Ljung, and M. Millnert, *Signalbehandling* (Studentlitteratur, in Swedish, 2000). The sample rate should of course exceed at least twice the bandwidth of the guitar signal to avoid aliasing.

Simulation of linear discrete time dynamical systems (filter) as $H(z, \hat{\theta})$ is a standard procedure and does not deserve any particular comments, other than that the sample rate $f_s=1/T_s$ should be chosen high enough compared to the bandwidth of the filter.

In one embodiment of the invention, the following algorithm is used for simulation of the DNL:

$$h_t = \begin{cases} h_{t-1}, & -1 < y_t < 1 \\ 1, & y_t = 1 \\ -1, & y_t = -1 \end{cases} \tag{41}$$

$$A_t = \max_{k=\in[t-L+1,t]} |y_k| \tag{42}$$

$$z_t = f(y_t/A_t; A_t, h_t) \tag{43}$$

where interpolation is used for the mode parameter $A_t$. This simplified algorithm uses the peak value of the input amplitude over a sliding window L, but more sophisticated methods can be used.

It is well-known that a non-linear function creates harmonics of the input signals. This is mostly a desired consequence and is needed to get the soft distortion of the tubes, as well as the attack during the transients. Of course, if these harmonics exceed the Nyqvist frequency $f_s/2$, they will be aliased and the sound quality will deteriorate. The standard procedure described in text books is to oversample the input signal and then anti-alias filter and decimate the output $z_t$. Oversampling can be done either after the linear filters at $y_t$, or by choosing high enough a sample rate of $u_t$ in the first place. However, we have found that the smooth form of the Chebyshev basis functions create very little unwanted high frequency harmonics, and this is probably a problem that occurs mainly if look-up tables and interpolation are used to represent a SNL $f(y)$.

Figure 12:
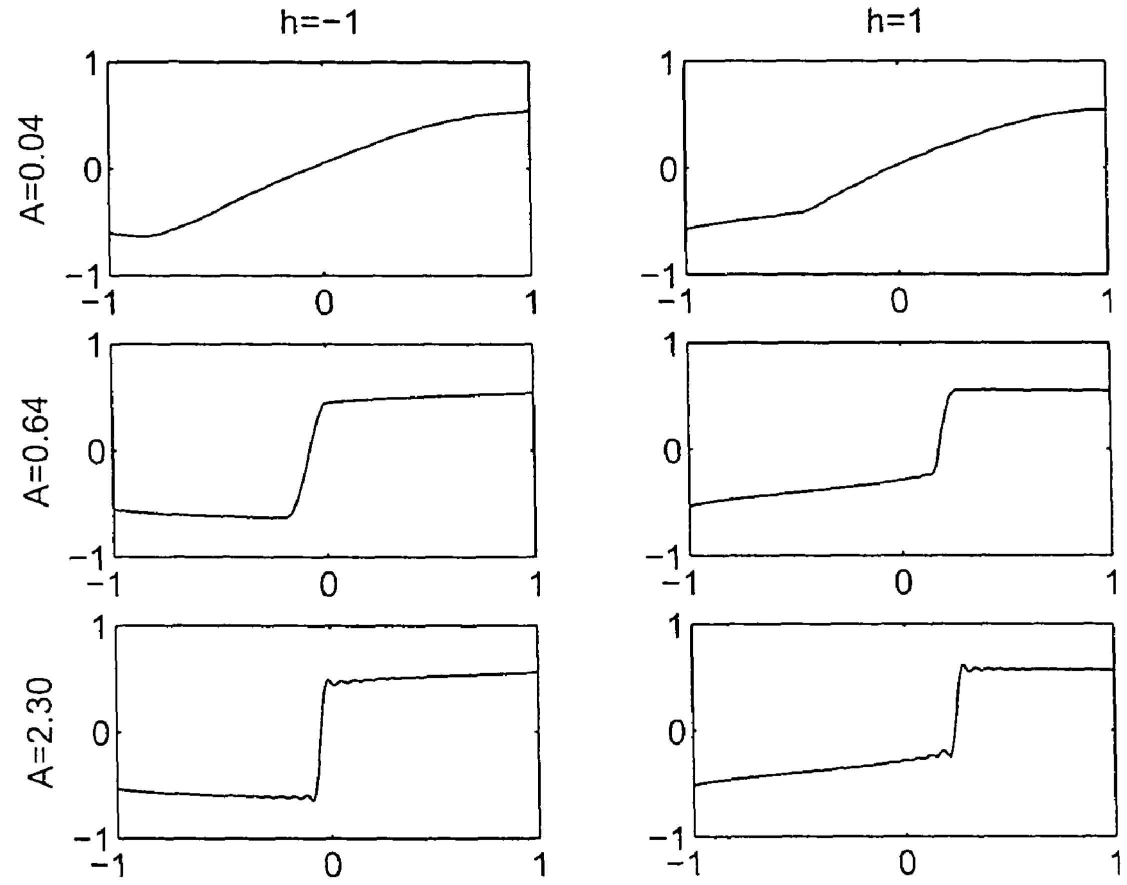
FIG. 12 shows an array of SNL for different mode parameters.

FIG. 12 shows an example of modeling a tube, where the model for three different amplitudes and both hysteresis modes is illustrated.

Filter Bank Implementation of DNL

As an alternative to the DNL, a filter bank approach can be used, where the energy in each frequency interval controls the dynamic non-linearity. A filter bank is defined by a set of band-pass filters $\{B_i(q)\}_{i=1}^{n}$, which may be orthogonal or overlapping in the frequency domain. Conceptually, they divide the frequency spectrum in different parts, and the output $x_t^i=B_i(q)y_t$ of each filter can be used to compute the energy $E(x_t^i)^2$ in the corresponding frequency interval. The mode parameter $m_t$ in (14) can now be taken as a vector of energies $$m_t=(E((x_t^1)^2,E((x_t^2)^2,E((x_t^n)^2). \quad (44)$$

That is, the operating point depends on the energy spectrum of the signal. A further alternative that has proven to work well for certain equipment as for instance loudspeakers, is to have separate non-linear functions to each frequency band, and then combine their outputs as $$z_t = \sum_i f(B_i(q)y_t). \quad (45)$$

This can be seen as an alternative to (14).

Summary of the Audio Equipment Emulator

Figure 5:
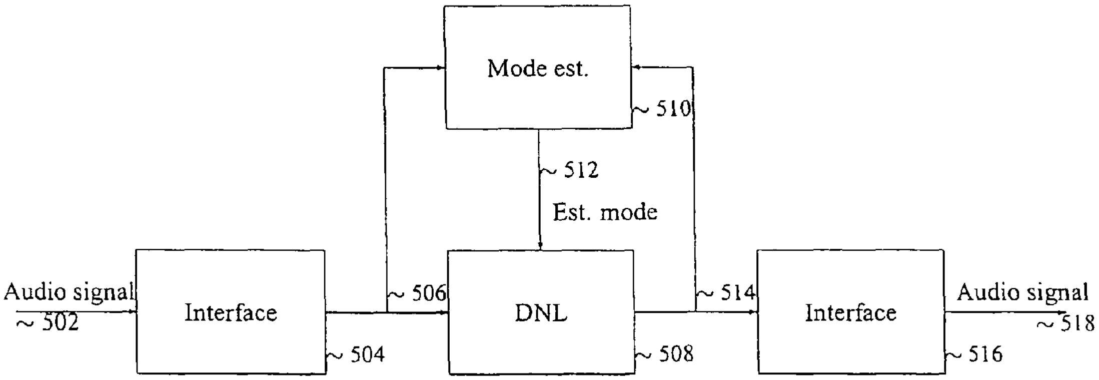
FIG. 5 shows a block diagram illustrating an embodiment of the invention applied for emulation of the modeled audio equipment.

To sum up, in one embodiment of the invention, the signal flow is structured as in FIG. 5. The analog audio signal (502) is connected to an analog to digital interface (504), whose output (506) is communicatively coupled to a dynamic non-linearity (508). The output (514) of this dynamic non-linearity is finally communicatively coupled to an interface (516) producing the output audio signal (518). The dynamic non-linearity consists of a mode switching static non-linear function, where the mode parameter (512) is estimated in a function (510) based on the previous values on the input (506) and output (514) of the dynamic non-linearity.

FIG. 1 gives a more detailed description of signal flow. First, the audio signal u(t) is passed through a linear filter $C_{pre}$ (102), and the output is called y(t). The amplitude or RMS value of this output called $\hat{A}(t)$ is estimated (104), and the normalized filtered signal $\bar{y}(t)$ is computed (106). This signal's amplitude is passed through the static non-linear functions $T_k(\bar{y}(t))$ (110) and $D_k(\bar{y}(t))$ (112). At the same time, the signal amplitude $\bar{A}(t)$ looks up the parameters $\hat{\alpha}_k(t)$ and $\hat{\beta}_k(t)$ (116) in an interpolation table (108), and the weighted sum $z(t)=\Sigma_k\hat{\alpha}_k(t)T_k(\bar{y}(t))+h(t)\hat{\beta}_k(t)D_k(\bar{y}(t))$ is computed (124). Finally, a linear equalizer filter $G_{eq}$ (126) may be applied.

Figure 2:
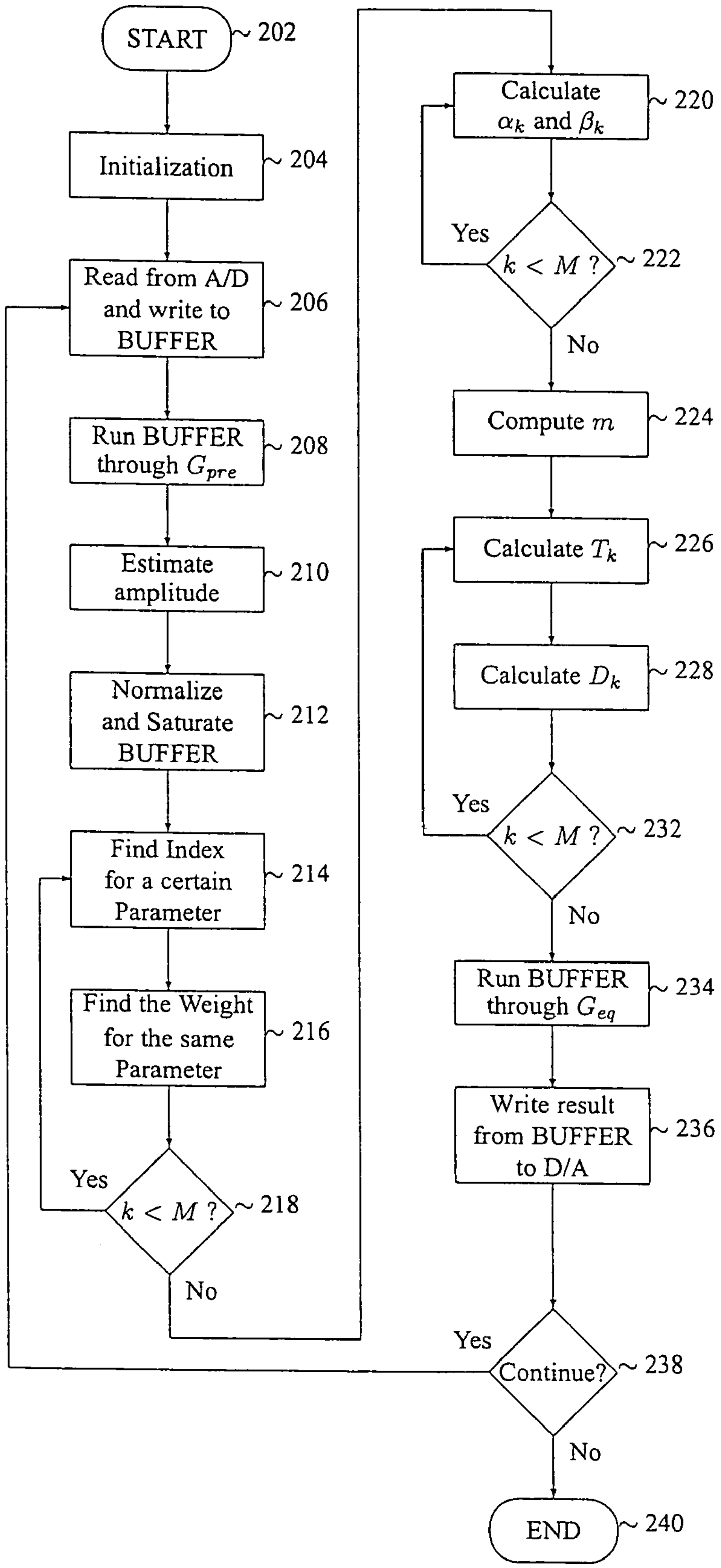
FIG. 2 shows a flowchart of the simulation.

A computer program for this embodiment may be structured according to FIG. 2. After initialization (204), the program reads the audio signal from an analog to digital converter (A/D) (206), and writes a block of signal values to a buffer. This buffer is then processed by some equations emulating the linear part $G_{pre}$ (208). Then the program estimates the amplitude (210) and possibly the instantaneous frequency, normalizes the buffer (212), and from this finds an index to a look-up table (214) where the unique parameter values in the DNL are stored (216), which is repeated for each index k (218) in the DNL, and the parameter value to be used is then interpolated from neighboring points (220).

The gain scheduling constant m to the DNL is computed (224) basis functions $D_k$ and $T_k$ (226,228) are then computed, which is repeated for each k (232), and these are weighted with the parameters $\alpha_k$ and $\beta_k$, respectively, and these terms are summed up. The buffer is then passed through some equations implementing a linear filter $G_{eq}$ (234) and finally the output is written to a D/A converter (236). The procedure is repeated (238) until the program ends (240).

Figure 3:
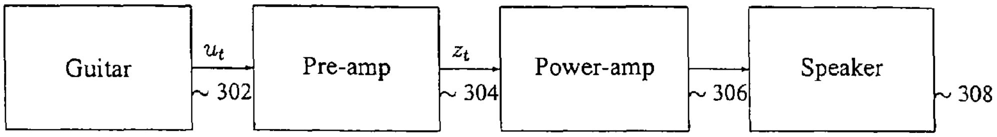
FIG. 3 shows a block diagram illustrating the audio equipment model. The physical amplifier box is replaced by a simulation of the signal $z_t$ from its input $u_t$. A similar methodology applies to the power-amplifier and loudspeaker.

FIG. 3 illustrates how several audio equipment emulators with different tuning can be put in series to emulate a complete amplifier, where for instance a guitar (302) is the connected to a pre-amplifier (304), which is connected to a power-amplifier (306) which in turn is connected to a loudspeaker (308).

Furthermore, the invention is in one embodiment realized as an apparatus, method or computer program product devised for simulating linear parts of an audio equipment using stable basis expansions of the filter, such as Kautz filters and delta operators. This embodiment can be combined with any of the other optional features of the invention in accordance with the description and the claims.

One further aspect of the invention in one embodiment, is realized as an apparatus, method or computer program product devised for controlling the dynamics of linear parts of an audio equipment using multivariable interpolation techniques of higher order linear filters. This embodiment can be combined with any of the other optional features of the invention in accordance with the description and the claims.

Summary of the Audio Equipment Automatic Modeling Procedure

Figure 4:
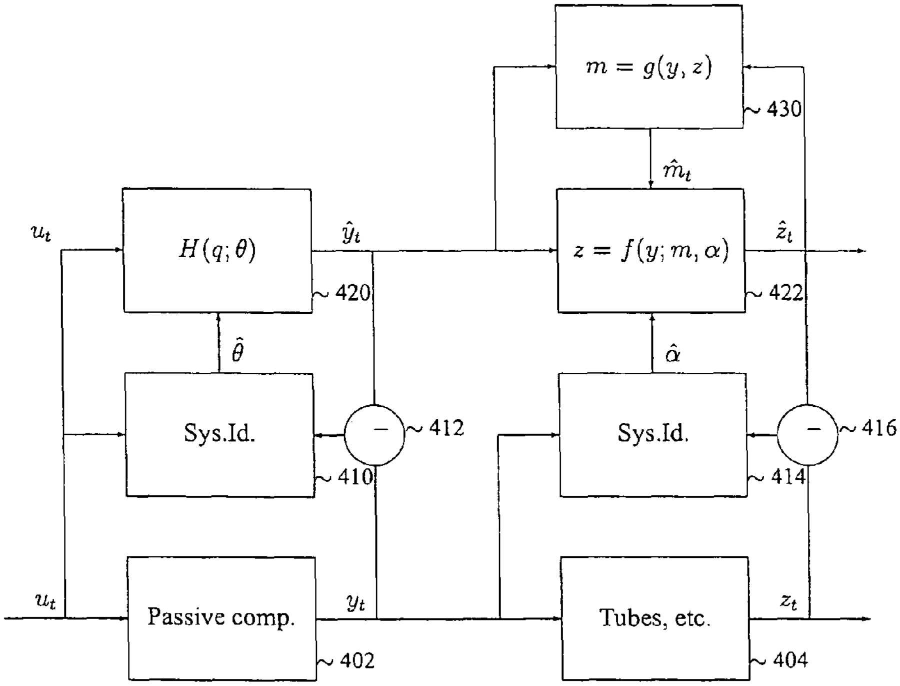
FIG. 4 shows a block diagram illustrating an embodiment of the invention applied for estimation of the model.

FIG. 4 summarizes in a block diagram how the modeling is done.

First, all passive components (402) form a linear system, where a linear model H(q; θ) (420) is estimated using standard system identification techniques (420) using the model error signal $y_t-\hat{y}_t$ (412).

Second, the non-linear parts as tubes (404) are modeled by the proposed new DNL structure $z=f(y; m, \alpha)$ (422), where a tailored new system identification algorithm (414) is applied to estimate the free parameters α using the error signal $z_t-\hat{z}_t$ (416). The gain scheduling parameter m is computed (430) for instance as instantaneous amplitude or frequency.

The invention claimed is:

1. An apparatus for emulation of electronic non-linear audio equipment, the apparatus configured to modify a received input audio signal into an output audio signal, comprising:

an input interface for receiving an input audio signal and producing a first signal;

a dynamic non-linearity (DNL) including at least three static non-linear (SNL) functions, said DNL being arranged such that a mode parameter decides which one of the at least three static non-linear (SNL) functions will be active, said DNL being further arranged to operate on said first signal and produce a second signal;

wherein the mode parameter is configured to switch to a first static non-linear (SNL) function under a first set of conditions, to switch to a second static non-linear function (SNL) under a second set of conditions and switch to a third static non-linear function (SNL) under a third set of conditions;

a mode estimator configured to receive said first signal as an input, said mode estimator being further configured to determine a mode as a function of at least one previous value of the first signal, and configured to transmit the determined mode to the emulator, wherein the mode estimator is configured to use at least one mode parameter to determine mode switching, the mode parameter is at least one of an energy, an amplitude and a peak value of the input signal during a short recent period of time; and an interface for outputting said second signal as an output audio signal.

2. The apparatus as recited in claim 1, further configured to utilize Chebyshev polynomials as a basis expansion in the one of the at least three static non-linear (SNL) functions.

3. The apparatus as recited in claim 2, further configured to table at least one basis expansion for each mode parameter, and to look up the at least one basis expansion in the table during emulation.

4. The apparatus as recited in claim 1, wherein hysteresis is an additional mode switching parameter.

5. The apparatus as recited in claim 1, further configured to utilize outputs of a filter bank to control the DNL.

6. The apparatus as recited in claim 1, further comprising a linear filter configured to shape the frequency characteristics of the input audio signal before being inputted to the dynamic non-linearity.

7. The apparatus as recited in claim 1, further comprising a linear filter configured to shape the frequency characteristics of the output signal from the dynamic non-linearity before being interfaced to an audio signal.

8. The apparatus as recited in claim 1, further configured to automatically identify at least one parameter in at least one of the at least three static non-linear functions.

9. The apparatus as recited in claim 8, further configured to identify series expansion coefficients by using sinusoids with different amplitudes and frequencies as input to identify the series expansion coefficients in Chebyshev polynomials used as a basis expansion in the one of the at least three static non-linear (SNL) functions.

10. The apparatus as recited in claim 1, further configured for emulation of guitar tube amplifiers.

11. The apparatus as recited in claim 1, further configured for emulation of microphones.

12. The apparatus as recited in claim 1, further configured for emulation of loud speakers.

13. The apparatus as recited in claim 1, further configured for emulation of linear parts in audio equipment.

14. The apparatus as recited in claim 1, further configured for controlling the dynamics of the linear parts in audio equipment.

15. The apparatus of claim 1, further configured for emulating linear parts of audio equipment using numerically stable basis expansions of the filter, wherein the expansions comprise Kautz or delta operators.

16. The apparatus of claim 1, further configured for controlling the dynamics of linear parts of audio equipment using multivariable interpolation based on non-linearly pre-compensated control inputs.

17. A method of emulating a target non-linear element configured to modify a received input audio signal into an output audio signal, the method comprising:

receiving, by an input interface, the input audio signal;

outputting, by the input interface, a first signal;

emulating, by an emulator, a dynamic non-linear (DNL) function of the target non-linear element by receiving the first signal and outputting a second signal, wherein the DNL function utilizes at least one mode operator, and wherein the mode operator switches to a first static non-linear (SNL) function under a first set of conditions, switches to a second static non-linear function (SNL) under a second set of conditions and switches to a third static non-linear function (SNL) under a third set of conditions;

receiving, by a mode estimator, the first signal, and determining a mode as a function of at least one previous value of the first signal, and transmitting the determined mode to the emulator;

using at least one mode parameter to determine the switching of the mode operator, the at least one mode parameter being at least one of an energy, an amplitude and a peak value of the input signal during a short recent time period;

receiving, by an interface, the second signal; and outputting, by the interface, the output audio signal.

18. The method of claim 17, wherein hysteresis is an additional mode parameter.

19. A non-transitory computer-readable medium encoded with a computer program, wherein the computer program, when executed by a computer, causes the computer to perform:

receiving, by an input interface, an input audio signal;

outputting, by the input interface, a first signal;

emulating, by an emulator, a dynamic non-linear (DNL) function of the target non-linear element by receiving the first signal and outputting a second signal, wherein the DNL function utilizes at least one mode operator, and wherein the mode operator switches to a first static non-linear (SNL) function under a first set of conditions, switches to a second static non-linear function (SNL) under a second set of conditions and switches to a third static non-linear function (SNL) under a third set of conditions;

receiving, by a mode estimator, the first signal, and determining a mode as a function of at least one previous value of the first signal, and transmitting the determined mode to the emulator;

using at least one mode parameter to determine the switching of the mode operator, the at least one mode parameter being at least one of an energy, an amplitude and a peak value of the input signal during a short recent time period;

receiving, by an interface, the second signal; and outputting, by the interface, the output audio signal.

20. The non-transitory computer-readable medium of claim 19, wherein the computer program, when executed by the computer, further causes the computer to perform:

using hysteresis as an additional mode parameter.

21. An apparatus for emulating a target non-linear element configured to modify a received input audio signal into an output audio signal, the apparatus comprising:

an input interface configured to receive the input audio signal and output a first signal;

an emulator configured to emulate a dynamic non-linear (DNL) function of the target non-linear element by receiving the first signal and outputting a second signal, wherein the DNL function is configured to utilize at least one mode operator, and wherein the mode operator is configured to switch to a first static non-linear (SNL) function under a first set of conditions, to switch to a second static non-linear function (SNL) under a second set of conditions and switch to a third static non-linear function (SNL) under a third set of conditions;

a mode estimator configured to receive the first signal, the mode estimator configured to determine a mode as a function of at least one previous value of the first signal, and configured to transmit the determined mode to the emulator, wherein the mode estimator is configured to use at least one mode parameter to determine mode switching, the at least one mode parameter being at least one of an energy, an amplitude and a peak value of the first signal during a short recent time period; and an interface configured for receiving the second signal and for outputting the output audio signal.

22. The apparatus of claim 21, wherein the mode estimator is configured to use hysteresis as an additional mode parameter.

* * * * *

UNITED STATES PATENT AND TRADEMARK OFFICE

CERTIFICATE OF CORRECTION

PATENT NO. : 8,165,309 B2
APPLICATION NO. : 10/872012
DATED : April 24, 2012
INVENTOR(S) : Fredrik Gustafsson et al.

It is certified that error appears in the above-identified patent and that said Letters Patent is hereby corrected as shown below:

(75) Inventors should read: Fredrik Gustafsson, Linköping (SE); Per Connman, Norrköping (SE); Oscar Öberg, Linköping (SE); Niklas Odelholm, Linköping (SE); Martin Enqvist, Linköping (SE)

Item (30) should read: Foreign Application Priority Data

Jun. 23, 2003 (SE) .................................0301790-2

Signed and Sealed this
Thirty-first Day of July, 2012

David J. Kappos
*Director of the United States Patent and Trademark Office*